US012057831B2

(12) United States Patent
Vrudhula et al.

(10) Patent No.: US 12,057,831 B2
(45) Date of Patent: Aug. 6, 2024

(54) THRESHOLD LOGIC GATES USING FLASH TRANSISTORS

(71) Applicants: Arizona Board of Regents on behalf of Arizona State University, Scottsdale, AZ (US); The Texas A&M University System, College Station, TX (US)

(72) Inventors: Sarma Vrudhula, Chandler, AZ (US); Sunil Khatri, College Station, TX (US)

(73) Assignees: Arizona Board of Regents on behalf of Arizona State University, Scottsdale, AZ (US); The Texas A&M University System, College Station, TX (US)

( * ) Notice: Subject to any disclaimer, the term of this patent is extended or adjusted under 35 U.S.C. 154(b) by 31 days.

(21) Appl. No.: 17/626,719

(22) PCT Filed: Jul. 10, 2020

(86) PCT No.: PCT/US2020/041653
§ 371 (c)(1),
(2) Date: Jan. 12, 2022

(87) PCT Pub. No.: WO2021/011394
PCT Pub. Date: Jan. 21, 2021

(65) Prior Publication Data
US 2022/0263508 A1 Aug. 18, 2022

Related U.S. Application Data

(60) Provisional application No. 62/873,504, filed on Jul. 12, 2019.

(51) Int. Cl.
*G11C 16/04* (2006.01)
*G11C 16/14* (2006.01)
(Continued)

(52) U.S. Cl.
CPC ..... *H03K 19/0027* (2013.01); *G11C 16/0483* (2013.01); *G11C 16/14* (2013.01);
(Continued)

(58) Field of Classification Search
CPC ..... G11C 16/0483; G11C 16/14; G11C 16/28; G11C 16/3404; G11C 29/32; H03K 19/0027
(Continued)

(56) References Cited

U.S. PATENT DOCUMENTS 6,781,885 B1    8/2004  Park et al.
7,202,698 B1 *  4/2007  Bauer ............... H03K 19/17728
                                                        326/39
(Continued)

FOREIGN PATENT DOCUMENTS

EP     1220228 A1 *  7/2002  ......... G11C 16/0441
WO   2014151323 A1    9/2014
WO   2021011394 A1    1/2021

OTHER PUBLICATIONS

Abusultan et al., "A Flash-based Digital Circuit Design Flow," 2016 IEEE/ACM International Conference on Computer-Aided Design (ICCAD), Nov. 7-10, 2016, Austin, TX, 6 pages.
(Continued)

*Primary Examiner* — Ly D Pham
(74) *Attorney, Agent, or Firm* — Lewis Roca Rothgerber Christie LLP

(57) ABSTRACT

Threshold logic gates using flash transistors are provided. In an exemplary aspect, flash threshold logic (FTL) provides a novel circuit topology for realizing complex threshold functions. FTL cells use floating gate (flash) transistors to realize all threshold functions of a given number of variables. The use of flash transistors in the FTL cell allows a fine-grained selection of weights, which is not possible in traditional
(Continued)

complementary metal-oxide-semiconductor (CMOS)-based threshold logic cells. Further examples include a novel approach for programming the weights of an FTL cell for a specified threshold function using a modified perceptron learning algorithm.

11 Claims, 8 Drawing Sheets

(51) Int. Cl.
    *G11C 16/28*     (2006.01)
    *G11C 16/34*     (2006.01)
    *H03K 19/00*     (2006.01)
    *G11C 29/32*     (2006.01)

(52) U.S. Cl.
    CPC .......... *G11C 16/28* (2013.01); *G11C 16/3404* (2013.01); *G11C 29/32* (2013.01)

(58) Field of Classification Search
    USPC ..................................................... 365/185.17
    See application file for complete search history.

(56) References Cited

U.S. PATENT DOCUMENTS

| | | | |
|---|---|---|---|
| 7,630,852 | B1 | 12/2009 | Ghanta et al. |
| 7,813,182 | B2 * | 10/2010 | Kamata .................. G11C 7/062 365/185.21 |
| 8,164,359 | B2 | 4/2012 | Leshner et al. |
| 8,181,133 | B2 | 5/2012 | Gowda et al. |
| 8,601,417 | B2 | 12/2013 | Gowda et al. |
| 8,723,575 | B1 | 5/2014 | Ooi et al. |
| 8,832,614 | B2 | 9/2014 | Vrudhula et al. |
| 9,306,151 | B2 | 4/2016 | Vrudhula et al. |
| 9,356,598 | B2 | 5/2016 | Vrudhula et al. |
| 9,466,362 | B2 | 10/2016 | Yu et al. |
| 9,473,139 | B2 | 10/2016 | Vrudhula et al. |
| 9,490,815 | B2 | 11/2016 | Vrudhula et al. |
| 9,876,503 | B2 | 1/2018 | Vrudhula et al. |
| 9,933,825 | B2 | 4/2018 | Hanumaiah et al. |
| 9,934,463 | B2 | 4/2018 | Seo et al. |
| 10,038,564 | B2 * | 7/2018 | Holcomb .................. G09C 1/00 |
| 10,133,323 | B2 | 11/2018 | Hanumaiah et al. |
| 10,250,236 | B2 | 4/2019 | Vrudhula et al. |
| 10,447,249 | B2 | 10/2019 | Vrudhula et al. |
| 10,551,869 | B2 | 2/2020 | Vrudhula et al. |
| 10,795,809 | B2 | 10/2020 | Yang et al. |
| 2006/0233006 | A1 | 10/2006 | Fant |
| 2016/0006438 | A1 * | 1/2016 | Vrudhula ............. G11C 13/004 326/24 |
| 2016/0261749 | A1 | 9/2016 | Femal |
| 2017/0373862 | A1 * | 12/2017 | Holcomb .................. G09C 1/00 |
| 2018/0145661 | A1 * | 5/2018 | Hwang .................. H03K 3/012 |
| 2018/0308772 | A1 * | 10/2018 | Seningen ............. B23K 26/352 |
| 2019/0340027 | A1 | 11/2019 | Brewer |
| 2019/0340154 | A1 | 11/2019 | Brewer |
| 2019/0340155 | A1 | 11/2019 | Brewer |
| 2020/0160159 | A1 | 5/2020 | Azari et al. |
| 2021/0013886 | A1 | 1/2021 | Vrudhula et al. |

OTHER PUBLICATIONS

Abusultan et al., "Implementing Low Power Digital Circuits using Flash Devices," 2016 IEEE 34th International Conference on Computer Design (ICCD), Oct. 2-5, 2016, Scottsdale, AZ, pp. 109-116.

Ahmed et al., "The effect of LUT and cluster size on deep-submicron FPGA performance and density," IEEE Transactions on Very Large Scale Integration (VLSI) Systems, vol. 12, No. 3, Apr. 5, 2004, pp. 288-298.

Amaru et al., "Majority-Inverter Graph: A New Paradigm for Logic Optimization," IEEE Transactions on Computer-Aided Design of Integrated Circuits and Systems, vol. 35, No. 5, Oct. 7, 2015, pp. 806-819.

An et al., "The threshold voltage fluctuation of one memory cell for the scaling-down NOR flash," 2010 2nd IEEE International Conference on Network Infrastructure and Digital Content, Sep. 24-26, 2010, Beijing, China, pp. 433-436.

Anderson et al., "Raising FPGA Logic Density Through Synthesis-Inspired Architecture," IEEE Transactions on Verly Large Scale Integration (VLSI) Systems, vol. 20, No. 3, Feb. 10, 2011, pp. 537-550.

Beiu V., "A survey of perceptron circuit complexity results," Proceedings of the International Joint Conference on Neural Networks, IEEE, Jul. 20-24, 2003, Portland, OR, pp. 989-994.

Beiu, V. et al., "Differential Implementations of Threshold Logic Gates," Proceedings of the 2003 International Symposium on Signals, Circuits and Systems (SCS 2003), vol. 2, Jul. 10-11, 2003, Romania, IEEE, pp. 489-492.

Beraudo et al., "Timing optimization of FGPA placements bylogic replication," Proceedings 2003, Design Automation Conference (IEEE Cat. No.03CH37451), Jun. 2-6, 2003, Anaheim, CA, pp. 196-201.

Betz et al. "VPR: A New Packing, Placement and Routing Tool for FPGA Research," Proceedings of the 7th International Workshop on Field-Programable Logic and Applications, Lecture Notes in Computer Science vol. 1304, Springer-Verlag Berlin Heidelberg, Sep. 1997, pp. 213-222.

Boboila et al., "Write Endurance in Flash Drives: Measurements and Analysis," Proceedings of the 8th USENIX conference on file and storage locations, Feb. 2010, 10 pages.

Bohossian et al., "Programmable neural logic," 1997 Proceedings Second Annual IEEE International Conference on Innovative Systems in Silicon, Oct. 8-10, 1997, Austin, TX, pp. 13-21.

Bohossian et al., "Programmable neural logic," IEEE Transactions on Components, Packaging, and Manufacturing Technology: Part B, vol. 21, No. 4, Nov. 1998, pp. 346-351.

Brayton et al., "ABC: An Academic Industrial-strength Verification Tool," International Conference on Computer Aided Verification, Lecture Notes in Computer Science, vol. 6174, Springer-Verlag Berlin Heidelberg, Jul. 15-19, 2010, Edinburgh, United Kingdom, pp. 24-40.

Cai et al., "Threshold voltage distribution in MLC NAND flash memory: Characterization, analysis, and modeling," 2013 Design, Automation, & Test in Europe Conference & Exhibition, IEEE, Mar. 18-22, 2013, Grenoble, France, 6 pages.

Celinski et al., "State of the art in CMOS threshold logic VLSI gate implementations and systems," Proceeding of SPIE vol. 5117, VLSI Circuits and Systems, Apr. 21, 2003, pp. 53-64.

Choi et al., "Device considerations for high density and highly reliable 3D NAND flash cell in near future," 2012 International Electron Devices Meeting, IEEE, Dec. 10-13, 2012, San Francisco, CA, 4 pages.

Cong et al., "FlowMap: an optimal technology mapping algorithm for delay optimization in lookup-table based FPGA designs," IEEE Transactions on Computer-Aided Design of Integrated Circuits and Systems, vol. 13, No. 1, Jan. 1994, pp. 1-12.

Farooq et al., "Chapter 2: FPGA Architectures:An Overview," Tree-based Heterogeneous FPGA Architectures: Application Specific Exploration and Optimization, Springer-Verlag New York, 2012, pp. 7-48.

Feng et al., "Improving FPGA performance with a S44 LUT structure," Proceedings of the 2018 ACM/SIGDA International Symposium on Field-Programmable Gate Arrays, Feb. 2018, pp. 61-66.

Fowler et al., "Electron Emission in Intense Electric Fields," Proceedings of the Royal Society of London, Seria A, Containing Papers of a Mathematical and Physical Character, vol. 119, No. 781, May 1, 2928, pp. 173-181.

Globalfoundries, "14LPP: 14nm FinFET Technology," 2018, 2 pages.

He et al., "Energy Efficient Reconfigurable Threshold Logic Circuit with Spintronic Devices," IEEE Transactions on Emerging Topics in Computing, vo. 5, No. 2, Dec. 9, 2016, pp. 223-237.

Intel, "Cyclone V Device Overview," CV-51001, May 7, 2018, 37 pages.

(56) References Cited

OTHER PUBLICATIONS

Jung et al., "A group-based wear-leveling algorithm for large-capacity flash memory storage systems," Proceedings of the 2007 Internationl Conference on Compilers, architecture, and synthesis for embedded systems, Sep. 2007, pp. 160-164.

Kaya et al., "Reconfigurable threshold logic gates with nanoscale DG-MOSFETs," Solid-State Electronics, vol. 51, No. 10, Oct. 2007, pp. 1301-1307.

Kim et al., "Synthesizable FGPA fabrics targetable by the Verilog-to-Routing (VTR) CAD flow," 2015 25th International Conference on Field Programmable Logic and Applications, IEEE, Sep. 2-4, 2015, London, UK, 8 pages.

Kulkarni et al., "A fast, energy efficient, field programmable threshold-logic array," 2014 International Conference on Field Programmable Technology (FPT), IEEE, Dec. 10-12, 2014, Shanghai, China, pp. 300-305.

Kulkarni et al., "Reducing power, leakage, and area of standard-cell asics using threshold logic flip-flops," IEEE Transactions on Very Large Scale Integration (VLSI) Systems, vol. 24, No. 9, Mar. 10, 2016, pp. 2873-2886.

Kumar et al., "A novel design of a memristor-based look-up table (LUT) for FPGA," 2014 IEEE Asia Pacific Conference on Circuits and Systems, Nov. 17-20, 2014, Ishigaki, Japan, pp. 703-706.

Kuon et al., "Measuring the Gap Between FPGAs and ASICs," IEEE Transactions on Computer-Aided Design of Integrated Circuits and Systems, vol. 26, No. 2, Jan. 11, 2007, 10 pages.

Liu, H. J., "Archipelago—An Open Source FPGA with Toolflow Support," Technical Report No. UCB/EECS-2014-43, EECS Department, University of California, Berkeley, May 1, 2014, 80 pages.

Ma et al., "An automatic RTL compiler for high-throughput FPGA implementation of diverse deep convolutional neural networks," 2017 27th International Conference on Field Programmable Logic and Applications, IEEE, Sep. 4-8, 2017, Ghent, Belgium, 8 pages.

Ma et al., "Optimizing the Convolution Operation to Accelerate Deep Neural Networks on FPGA," IEEE Transactions on Very Large Scale Integration (VLSI) Systems, vol. 26, No. 7, Apr. 3, 2018, pp. 1354-1367.

Microsemi, "UG0680 User Guide: PolarFire FGPA Fabric," published on Jan. 1, 2017, last updated Apr. 28, 2020, 108 pages.

Mozaffari et al., Maximizing the No. of threshold logic functions using resistive memory, IEEE Transactions on Nanotechnology, vol. 17, No. 5, Apr. 2, 2018, pp. 897-905.

Nukala et al., "Spintronic Threshold Logic Array (STLA)—a compact, low leakage, non-volatile gate array architecture," 2012 IEEE/ACM International Symposium on Nanoscale Architectures (NANOARCH), Jul. 4-6, 2012, Amsterdam, Netherlands, pp. 188-195.

Qureshi et al., "Enhancing lifetime and security of PCM-based Main Memory with Start-Gap Wear Leveling," 2009 42nd Annual IEEE/ACM International Symposium on Microarchitecture (MICRO), Dec. 12-16, 2009, New York, NY, pp. 14-23.

Raspa et al., "A framework with cloud integration for CNN acceleration on FPGA devices," 2018 IEEE International Parallel and Distributed Processing Symposium Workshops, May 21-25, 2018, Vancouver, BC, pp. 170-177.

Ray et al., "Mapping into LUT structures," Proceedings of the Conference on Design, Automation and Test in Europe, Mar. 2012, pp. 1579-1584.

Rodriguez-Villegas et al., "High-speed low-power logic gates using floating gates," 2002 IEEE International Symposium on Circuits and Systems, Proceedings (Cat. No.02CH37353), May 26-29, 2002, Phoenix, AZ, pp. 389-392.

Rosenblatt, F., "The perceptron: A probabilistic model for information storage and organization in the brain," Psychological Review, vol. 65, No. 6, 1958, pp. 386-408.

Tang et al., "A Study on the Programming Structures for RRAM-Based FPGA Architectures," IEEE Transactions on Circuits and Systems I: Regular Papers, vol. 63, No. 4, Mar. 10, 2016, pp. 503-516.

Wagle, A. et al., "Threshold Logic in a Flash," 2019 IEEE 37th International Conference on Computer Design (ICCD), arXiv:1910.04910v1 [cs.ET], Oct. 10, 2019, 9 pages.

Williams et al., "Architecture and Circuit Design of an All-Spintronic FPGA," Proceedings of the 2018 ACM/SIGDA International Symposium on Field-Programmable Gate Arrays, Feb. 25-27, 2018, Monterey, CA, pp. 41-50.

Xilinx, "7 Series FPGAs Confugurable Logic Block: User Guide," UG474 (v1.8), Sep. 27, 2016, 74 pages.

Yang et al., "Integration of threshold logic gates with RRAM devices for energy efficient and robust operation," 2014 IEEE/ACM International Symposium on Nanoscale Architectures (NANOARCH), Jul. 8-10, 2014, Paris, France, pp. 39-44.

Yang et al., U.S. Appl. No. 17/063, 185, filed Oct. 5, 2020.

Zgheib et al., "Evaluating FPGA clusters under wide ranges of design parameters," 2017 27th International Conference on Field Programmable Logic and Applications (FPL), IEEE, Sep. 4-8, 2017, Ghent, Belgium, 8 pages.

Zhou et al., "An FPGA-based accelerator implementation for deep convolutional neural networks," 2015 4th International Conference on Computer Science and Network Technology, IEEE, Dec. 19-20, 2015, Harbin, China, pp. 829-832.

International Search Report and Written Opinion for International Patent Application No. PCT/US2020/041653, mailed Oct. 7, 2020, 9 pages.

Non-Final Office Action for U.S. Appl. No. 16/926,718, mailed Sep. 29, 2021, 11 pages.

* cited by examiner

THRESHOLD LOGIC GATES USING FLASH TRANSISTORS

RELATED APPLICATIONS

This application is a 35 U.S.C. § 371 national phase filing of International Application No. PCT/US2020/041653, filed Jul. 10, 2020, which claims the benefit of provisional patent application Ser. No. 62/873,504, filed Jul. 12, 2019, the disclosures of which are hereby incorporated herein by reference in their entireties.

GOVERNMENT SUPPORT

This invention was made with government support under 1701241 awarded by the National Science Foundation. The government has certain rights in the invention.

FIELD OF THE DISCLOSURE

This application relates to logic circuits, and more particularly to logic circuits implementing a threshold logic function.

BACKGROUND

Static complementary metal-oxide-semiconductor (CMOS) has been the dominant technology for the design of digital integrated circuits for more than three decades. Methods to optimize its performance, power and area (PPA) have been thoroughly developed and incorporated in commercial design tools, leaving few opportunities, if any, for further improvements. This suggests that if there are to be any further advances in improving PPA at the logic and circuit levels, the conventional way of computing logic functions has to be revisited. Although there are several nanotechnologies currently being investigated as alternatives to static CMOS, they remain at the research stage, and even if one emerges as a clear winner, large scale manufacturability is still far in the future.

The study of threshold functions and the development of threshold gates dates back to the 1960s. Since then, in addition to an extensive body of theoretical work on threshold logic, there have been many papers on circuit architectures of threshold gates. More recently, the focus has shifted to exploring the use of emerging devices such as resistive random access memory (RRAM), spin transfer torque magnetic tunnel junctions (STT-MTJs), etc., to implement threshold gates. However, until recently, due to the lack of design tools and incompatibility with existing design methodologies, threshold logic remained outside mainstream very large-scale integration (VLSI) design.

Recently, an architecture of a threshold gate, referred to as pNAND, has been proposed which can be integrated with a standard-cell application-specific integrated circuit (ASIC) design methodology using commercial tools. The architecture of the pNAND, however, severely limits the number of threshold functions that can be implemented.

SUMMARY

Threshold logic gates using flash transistors are provided. In an exemplary aspect, flash threshold logic (FTL) provides a novel circuit topology for realizing complex threshold functions. FTL cells use floating gate (flash) transistors to realize all threshold functions of a given number of variables. The use of flash transistors in the FTL cell allows a fine-grained selection of weights, which is not possible in traditional complementary metal-oxide-semiconductor (CMOS)-based threshold logic cells. Further examples include a novel approach for programming the weights of an FTL cell for a specified threshold function using a modified perceptron learning algorithm.

The FTL cell architecture exhibits significant improvements in area (73.3%), power (63.8%), and performance (17.7%) compared to 40 nm CMOS standard-cell based implementations of the threshold functions. The programmed FTL cells are shown to be robust against process, supply voltage, and temperature (PVT) variations. Other examples provide a solution for negating the effects of aging and process variations post-fabrication. The FTL cells can be used in tandem with static CMOS standard-cell based design styles, offering an advantage over the pNAND described above.

An exemplary embodiment provides a floating gate-based threshold logic cell in an integrated circuit, comprising: a first input network comprising a first set of semiconductor switching devices; a second input network comprising a second set of semiconductor switching devices; a sense amplifier coupled to the first input network and the second input network, wherein the sense amplifier comprises a third set of semiconductor switching devices; and a memory element comprising a fourth set of semiconductor switching devices coupled to one or more outputs of the sense amplifier.

Another exemplary embodiment provides an integrated circuit, comprising: a transistor-based programmable input circuit; a sense amplifier coupled to the programmable input circuit such that the programmable input circuit and the sense amplifier perform a programmed threshold logic function; and a memory element configured to store a result of the programmable sense amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
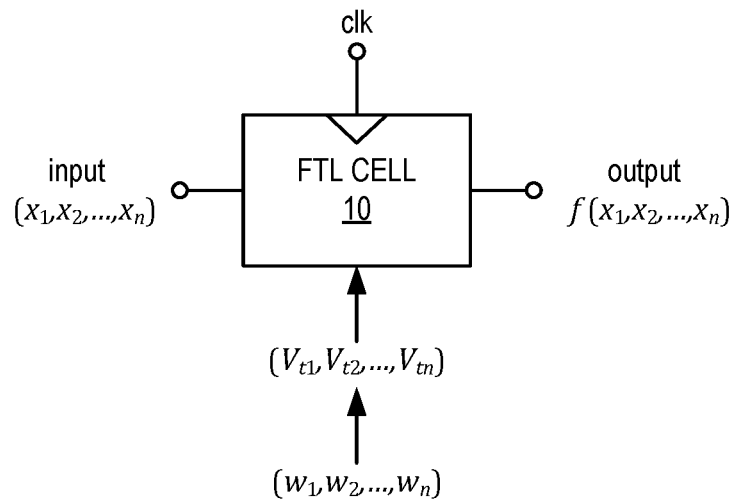
FIG. 1 is a schematic diagram of an exemplary flash threshold logic (FTL) cell.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Threshold logic gates using flash transistors are provided. In an exemplary aspect, flash threshold logic (FTL) provides a novel circuit topology for realizing complex threshold functions. FTL cells use floating gate (flash) transistors to realize all threshold functions of a given number of variables. The use of flash transistors in the FTL cell allows a fine-grained selection of weights, which is not possible in traditional complementary metal-oxide-semiconductor (CMOS)-based threshold logic cells. Further examples include a novel approach for programming the weights of an FTL cell for a specified threshold function using a modified perceptron learning algorithm.

The FTL cell architecture exhibits significant improvements in area (73.3%), power (63.8%), and performance (17.7%) compared to 40 nm CMOS standard-cell based implementations of the threshold functions. The programmed FTL cells are shown to be robust against process, supply voltage, and temperature (PVT) variations. Other examples provide a solution for negating the effects of aging and process variations post-fabrication. The FTL cells can be used in tandem with static CMOS standard-cell based design styles, offering an advantage over the pNAND described above.

I. Threshold Logic Overview

FIG. 1 is a schematic diagram of an exemplary FTL cell 10. The FTL circuit architecture described herein achieves significant improvements of all three performance, power, and area (PPA) metrics. In addition, the FTL cell 10 has several features that are not available with other, previously suggested alternatives to static CMOS logic. First, the FTL cell 10 is fully compatible and easily combined with CMOS logic. Second, it can be processed by commercial design tools without any changes, other than the addition of a few FTL "standard" cells. Third, the FTL cell 10 employs mature integrated circuit (IC) technologies (CMOS and Flash) that are commercially manufactured and integrated today.

The FTL circuit architecture differs fundamentally from a conventional CMOS-based design in three ways. First, the FTL cell 10 is a single, clocked, programmable cell that implements any threshold function $f(x_1, x_2, \ldots x_n)$ of nor fewer variables. A threshold function $f(x_1, x_2, \ldots x_n)$ is a subset of Boolean functions whose onset and offsets are linearly separable. That is, there exists a vector of weights $(w_1, w_2, \ldots, w_n)^1$ and a threshold T such that $$f(x_1, x_2, \ldots x_n) = 1 \Leftrightarrow \Sigma_{i=1}^n w_i x_i \geq T \qquad \text{Equation 1}$$

where $\Sigma$ denotes the arithmetic sum. Thus, a threshold function can be represented by $(W,T)=(w_1, w_2, \ldots, w_n; T)$. Each FTL cell 10 on a chip is programmed after manufacture to implement any threshold function of n or fewer variables. An example of a 5-input threshold function is a 3-out-of-5 majority function: $f(a, b, c, d, e)=a+b+c+d+e \geq 3 \equiv [w_a, w_b, w_c, w_d, w_e; T]=[1,1,1,1,1; 3]$. An XOR is a simple example of a non-threshold function.

In an exemplary aspect, the FTL cell 10 is edge-triggered, and consequently evaluates a minterm of the programmed threshold function on a clock edge. Hence, the FTL cell 10 may be viewed as a multi-input flip-flop whose output is $f(x_1, x_2, \ldots x_n)$, in contrast to a conventional D-type flip-flop whose output is $f(x)=x$.

The second difference is the integration of flash transistors with metal-oxide-semiconductor field effect transistors (MOSFETs) inside an FTL cell 10 to implement threshold logic functions, in contrast to their conventional use in memory. The vector of threshold voltages ($V_t$) of the flash transistors serves as a proxy for the weights that define the FTL cell 10. Hence, the programming of an FTL cell is performed by constructing a mapping between weights and threshold voltages. Since the $V_t$ of the flash transistors can be programmed with high precision, the FTL cell 10 can implement weights with great fidelity. It is important to note that the term threshold used in describing the threshold voltage of a flash transistor and threshold functions are not related in any way. The former is an electrical quantity while the latter refers to a set of Boolean functions.

The third difference is the mapping between weights of a given threshold function $f=(w_1, w_2, \ldots, w_n; T)$ and the flash transistor threshold voltages. This is a complex, non-linear, multi-valued mapping. That is, several different $V_t$s may correspond to a given W, each determined by the complex electrical and layout characteristics of the MOSFETs and flash transistors in the FTL cell 10. Given a layout extracted netlist of the FTL cell 10, and a threshold function $f=(W,T)$, a novel modification of the classical perceptron learning algorithm is presented which works in concert with HSPICE to determine one $V_t$ of the FTL cell 10 that computes $f$. This algorithm accounts for the layout parasitics and process variations. Like the original perceptron learning algorithm, the modified perceptron learning algorithm is guaranteed to converge, ensuring that a solution ($V_t$) for the given layout of the FTL cell 10 will be found in a finite number of steps, if one vector exists.

The FTL cell 10 includes the following advantages over traditional CMOS design:

- The fine-grained, post-manufacture flash threshold voltage programmability allows precise speed binning.
- By re-programming the flash design in-field, the FTL cell 10 provides the ability to mitigate effects like aging.
- Unlike flash memory, the FTL cell 10 does not suffer from endurance issues. Flash transistors can endure a finite number of write cycles (1K to 100K). In this approach, the flash devices will be programmed a few times at most after fabrication, and then again to possibly adjust for aging effects (in the field).
- The design methodology using FTL cells 10 results in a CMOS standard cell netlist with embedded FTL cells 10, whose functions are unknown during fabrication, preventing a foundry operator from reverse engineering the design.

II. Flash Transistors

Figure 2:
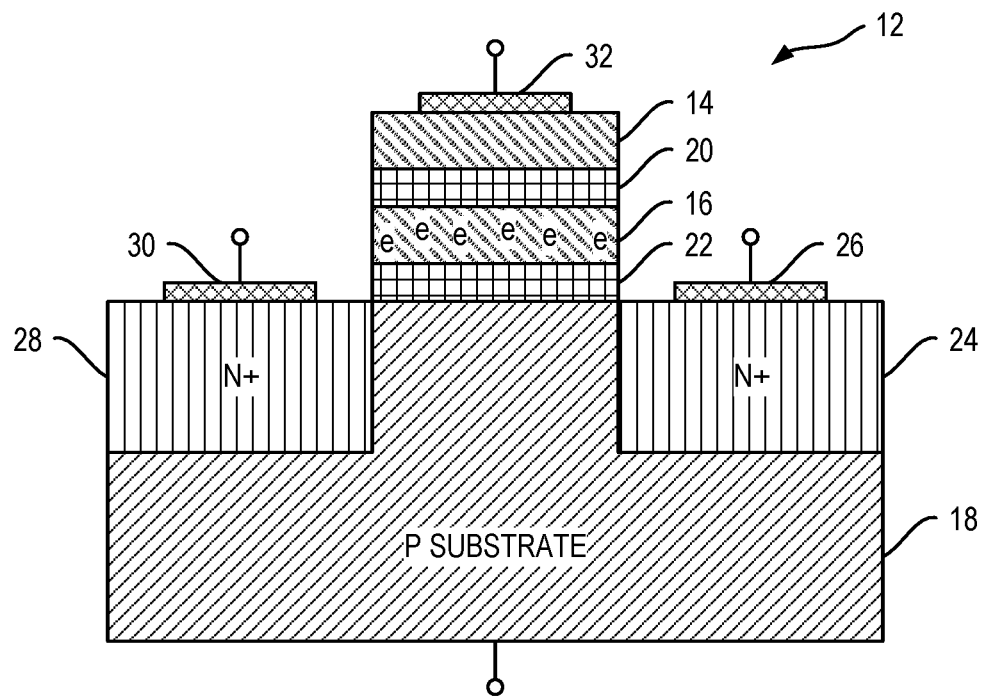
FIG. 2 is a cross-sectional view of an exemplary flash transistor.

FIG. 2 is a cross-sectional view of an exemplary flash transistor 12. Flash transistors 12 (e.g., floating gate transistors) are dual-gate field effect transistors (DGFETs). A first gate is called a control gate 14 and a second gate is a floating gate 16. The control gate 14 is similar to the gate of a traditional MOSFET. The floating gate 16 is inserted between a substrate 18 and the control gate 14, and is electrically and physically isolated (e.g., with a first dielectric layer 20 between the control gate 14 and the floating gate 16, and a second dielectric layer 22 between the floating gate 16 and the substrate 18). Consequently, current cannot flow into (or out of) the floating gate 16, unless electrons are forced to enter (or leave) the floating gate 16 from (or to) the substrate 18 by a phenomenon known as Fowler-Nordheim (FN) tunneling.

The flash transistor 12 is programmed by holding its body (e.g., at the substrate 18), source 24 (e.g., through a source electrode 26), and drain 28 (e.g., through a drain electrode 30) at ground and applying a high voltage (e.g., 10-20 volts) to the control gate 14 (e.g., through a control gate electrode 32). The resulting electric field forces electrons to tunnel from the substrate 18 into the floating gate 16, increasing the threshold voltage $V_t$ of the flash transistor 12. The resulting threshold voltage $V_t$ depends on the number of electrons that tunnel into the floating gate 16, which depends on the duration of the programming pulse.

Significantly, the threshold voltage $V_t$ of the flash transistor 12 can be adjusted with a fine granularity. Once electrons are trapped in the floating gate 16, they remain trapped for many years, or until removed by an erase operation. The flash transistor 12 can be erased by holding the control gate 14 to ground, floating the drain 28 and source 24, and applying a high voltage at the body (e.g., at the substrate 18). Erasing can be performed on many transistors (which share a common body) at once.

III. Threshold Function Mapping

Figure 3B:
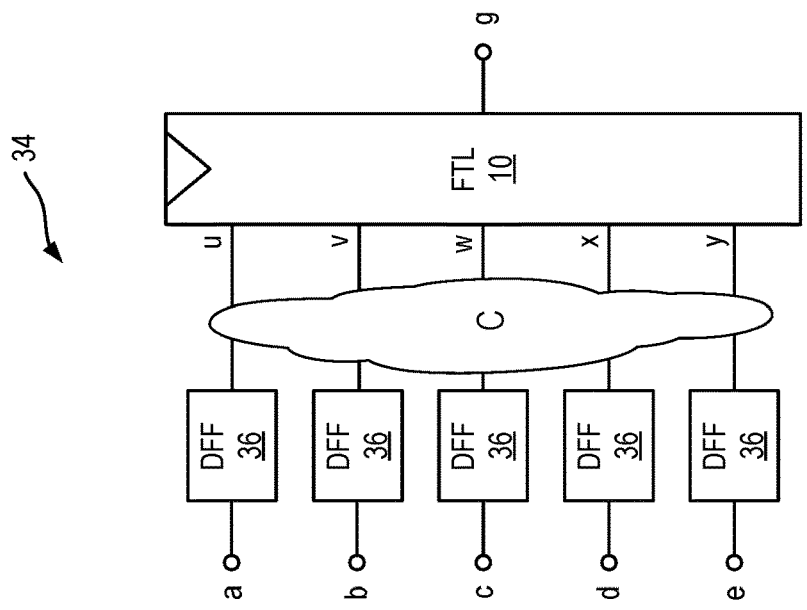
FIG. 3B illustrates the threshold function mapping of FIG. 3A with the FTL cell of FIG. 1 replacing the logic circuit.
Figure 3A:
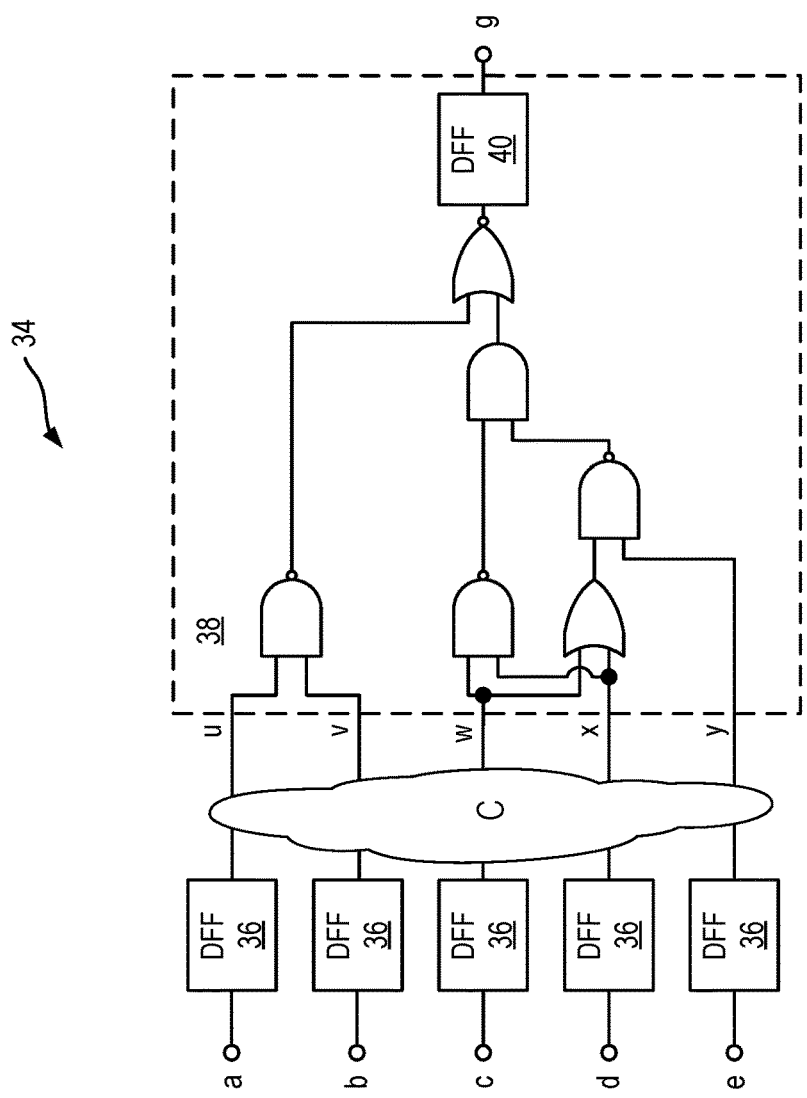
FIG. 3A is a schematic diagram of an exemplary threshold function mapping for the FTL cell of FIG. 1.

FIG. 3A is a schematic diagram of an exemplary threshold function mapping 34 for the FTL cell 10 of FIG. 1. Consider the circuit shown in FIG. 3A, and let an input $z=(a, b, c, d, e)$ (which can include input D flip-flops (DFF) 36. Suppose $g(a, b, c, d, e)$ can be decomposed as:

$$g(a,b,c,d,e)=H(u(z),v(z),w(z),x(z),y(z)) \qquad \text{Equation 2}$$

where H is a threshold function of its arguments. A logic circuit 38 shown in the box, including an output DFF 40, can be replaced by the FTL cell 10, as shown in FIG. 3B.

FIG. 3B illustrates the threshold function mapping 34 of FIG. 3A with the FTL cell 10 of FIG. 1 replacing the logic circuit 38. The FTL cell 10 can be programmed after fabrication to realize H. Due to the absorption of the logic by the FTL cell 10, and the increased slack it creates, conventional optimization tools can readily exploit this to achieve significant improvements in power, area, and performance.

IV. Flash Threshold Logic Cell Architecture

Figure 4A:
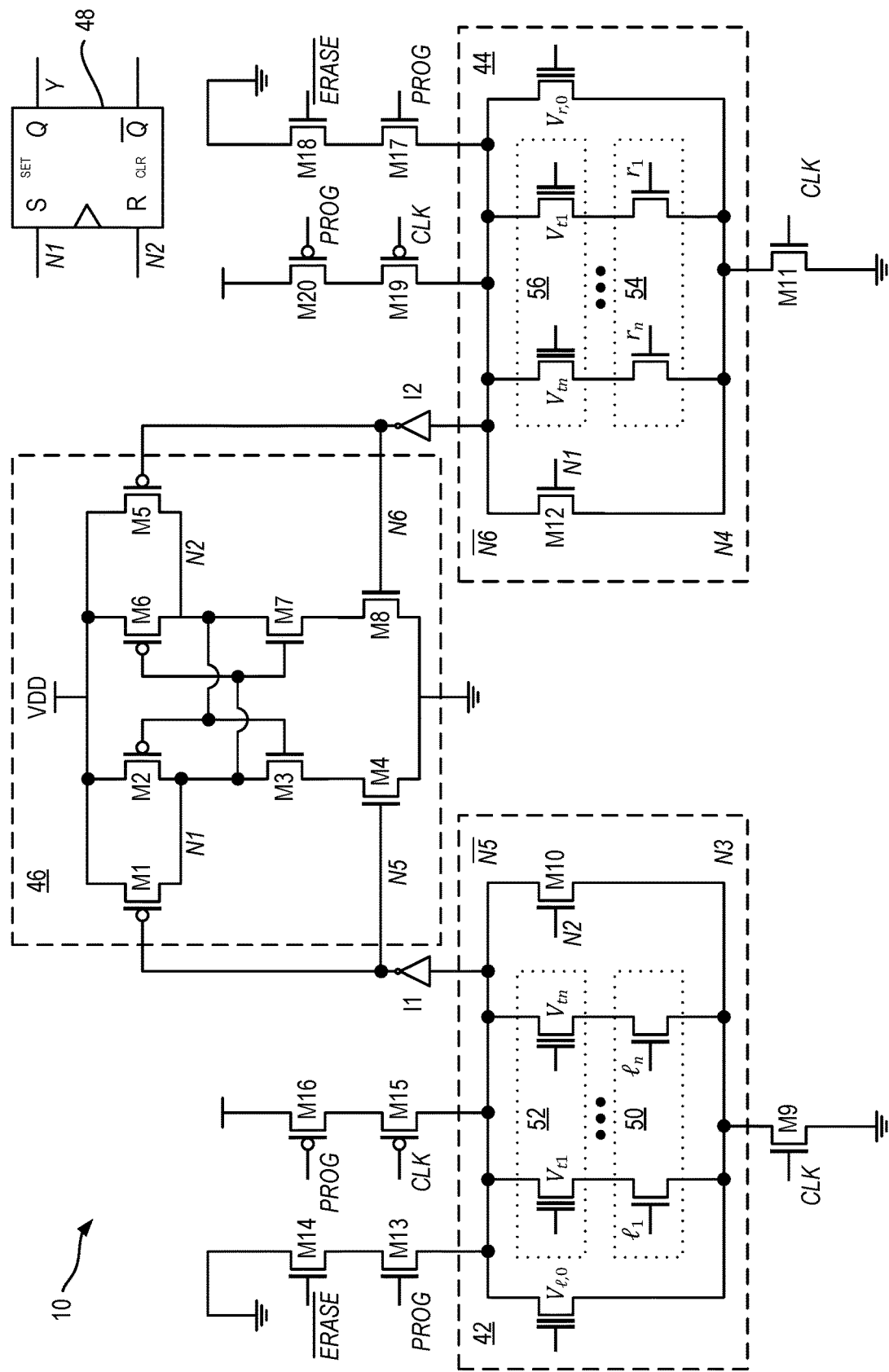
FIG. 4A is a schematic diagram of exemplary architecture of the FTL cell of FIG. 1.

FIG. 4A is a schematic diagram of exemplary architecture of the FTL cell 10 of FIG. 1. The FTL cell 10 has four main components: a first input network 42, a second input network 44, a sense amplifier 46, and a memory element 48 (e.g., an output latch). The first input network 42 (also referred to as a left input network) receives a first set of inputs ($l_1, \ldots, l_n$) and the second input network 44 (referred to as a right input network) receives a second set of inputs ($r_1, \ldots, r_n$). The first input network 42 and the second input network 44 are programmable, and work in conjunction with the sense amplifier 46 to perform a programmed threshold logic function on the first set of inputs ($l_1, \ldots, l_n$) and the second set of inputs ($r_1, \ldots, r_n$).

In an exemplary aspect, the first set of inputs ($l_1, \ldots, l_n$) is connected to a first CMOS transistor network 50 in series with a first flash transistor network 52. Similarly, the second set of inputs ($r_1, \ldots, r_n$) is connected to a second CMOS transistor network 54 in series with a second flash transistor network 56. The conductivity of the first input network 42 and the second input network 44 is determined by the state of the inputs and the threshold voltages ($V_{t1}, \ldots, V_{tn}$) of the flash transistors in the flash transistor networks 52, 56. Although the inputs in the first input network 42 and the second input network 44 can be independent, in some examples they are forced to be complementary (i.e., $r_i = \overline{l_i}$) to avoid metastability.

The sense amplifier 46 of the FTL cell 10 provides two differential signals N1 and N2, which serve as inputs to the memory element 48 (e.g., an SR latch or another latch as appropriate). When [N1, N2]=[0,1] the memory element 48 is set and the output Y=1. When [N1, N2]=[1,0], the memory element 48 is reset and the output Y=0. The magnitudes of the two sides of the inequality Equation 1 are mapped to a first conductance $G_L$ of the first input network 42 and a second conductance $G_R$ of the second input network 44, such that [N1, N2]=[0,1]$\leftrightarrow G_L > G_R$ and [N1, N2]=[1,0]$\leftrightarrow G_L < G_R$.

As stated earlier, the flash transistor threshold voltages ($V_{t1}, \ldots, V_{tn}$) serve as a proxy to the weights of the threshold function—the higher the weight, the lower the threshold will be. For a given threshold function, this non-linear monotonic relationship is learned using a modified perceptron learning algorithm described in Section V.

In an exemplary aspect, the sense amplifier 46 implements a comparator circuit in CMOS, comparing a first sense input voltage N5 from the first input network 42 with a second sense input voltage N6 from the second input network 44. The sense amplifier 46 is coupled between a system voltage VDD (which can be a battery voltage or a logic high voltage) and ground. A first CMOS transistor M1 (e.g., a p-doped metal-oxide-semiconductor (PMOS) transistor) has a gate connected to the first sense input voltage N5, a source connected to the system voltage VDD, and a drain connected to the first differential signal N1. A second CMOS transistor M2 (e.g., a PMOS transistor) is connected in parallel with the first CMOS transistor M1 and in series with a third CMOS transistor M3 (e.g., an n-doped metal-oxide-semiconductor (NMOS) transistor) and a fourth CMOS transistor M4 (e.g., an NMOS transistor). The fourth NMOS transistor M4 has a gate connected to the first sense input voltage N5 and a drain connected to ground.

Similarly, a fifth CMOS transistor M5 (e.g., a PMOS transistor) has a gate connected to the second sense input voltage N6, a source connected to the system voltage VDD, and a drain connected to the second differential signal N2. A sixth CMOS transistor M6 (e.g., a PMOS transistor) is connected in parallel with the fifth CMOS transistor M5 and in series with a seventh CMOS transistor M7 (e.g., an NMOS transistor) and an eighth CMOS transistor M8 (e.g., an NMOS transistor). The eighth CMOS transistor M8 has a gate connected to the second sense input voltage N6 and a drain connected to ground. A gate of the second CMOS transistor M2 is connected to a gate of the third CMOS transistor M3 and to the second differential signal N2. A gate of the sixth CMOS transistor M6 is connected to a gate of the seventh CMOS transistor M7 and to the first differential signal N1.

In another exemplary aspect, the first sense input voltage N5 is connected to a first top node $\overline{N5}$ of the first input network 42 via a first inverter I1. A source of each flash transistor of the first flash transistor network 52 is connected to the first top node $\overline{N5}$, and a drain of each CMOS transistor of the first CMOS transistor network 50 is connected to a first bottom node N3 of the first flash transistor network 52. The first bottom node N3 is connected to ground via a ninth CMOS transistor M9 controlled by a clock input CLK. Feedback can be provided through a tenth CMOS transistor M10 connected between the first top node $\overline{N5}$ and the first bottom node N3, with a gate connected to the second differential signal N2. In some examples, a first special flash transistor can be coupled between the first top node $\overline{N5}$ and the first bottom node N3, with a first special threshold voltage $V_{l,0}$, as described further in Section V.

Similarly, the second sense input voltage N6 is connected to a second top node $\overline{N6}$ of the second input network 44 via a second inverter I2. A source of each flash transistor of the second flash transistor network 56 is connected to the second top node $\overline{N6}$, and a drain of each CMOS transistor of the second CMOS transistor network 54 is connected to a second bottom node N4 of the first flash transistor network 52. The second bottom node N4 is connected to ground via an eleventh CMOS transistor M11 controlled by the clock input CLK. Feedback can be provided through a twelfth CMOS transistor M12 connected between the second top node $\overline{N6}$ and the second bottom node N4, with a gate connected to the first differential signal N1. In some examples, a second special flash transistor can be coupled between the second top node $\overline{N6}$ and the second bottom node N4, with a second special threshold voltage $V_{r,0}$, as described further in Section V.

Figure 4B:
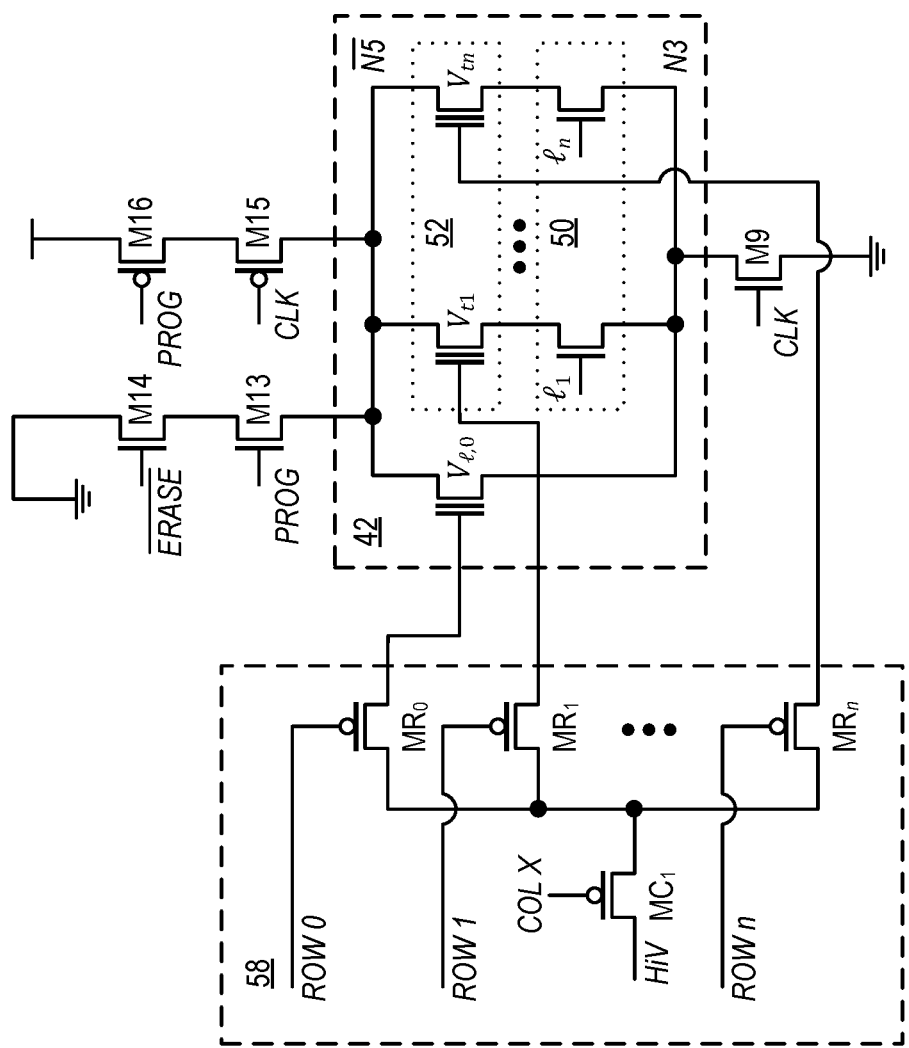
FIG. 4B is a schematic diagram of programming logic for the FTL cell of FIG. 4A.

FIG. 4B is a schematic diagram of programming logic 58 for the FTL cell 10 of FIG. 4A. The programming logic 58 is illustrated with respect to the first input network 42, but it should be understood that the same or additional programming logic 58 is connected to the second input network 44 in a similar manner.

With continuing reference to FIGS. 4A and 4B, the FTL cell 10 has three modes: programming, erase, or regular mode. The threshold voltage $V_t$ values of the flash transistors are set in the programming mode and erased in the erase mode. The evaluation takes place in the regular mode. The mode is set according to the values of a programming signal PROG and an erase signal ERASE.

For the first input network 42, a thirteenth CMOS transistor M13 (e.g., an NMOS transistor) is connected in series with a fourteenth CMOS transistor M14 (e.g., an NMOS transistor) between the first top node $\overline{N5}$ and ground. The programming signal PROG is connected to a gate of the thirteenth CMOS transistor M13, and the erase signal ERASE is connected to a gate of the fourteenth CMOS transistor M14. A fifteenth CMOS transistor M15 (e.g., a PMOS transistor) is connected in series with a sixteenth CMOS transistor M16 (e.g., a PMOS transistor) between the first top node $\overline{N5}$ and the system voltage VDD. The clock signal CLK is connected to a gate of the fifteenth CMOS transistor M15, and the programming signal PROG is connected to a gate of the sixteenth CMOS transistor M16.

For the second input network 44, a seventeenth CMOS transistor M17 (e.g., an NMOS transistor) is connected in series with an eighteenth CMOS transistor M18 (e.g., an NMOS transistor) between the second top node $\overline{N6}$ and ground. The programming signal PROG is connected to a gate of the seventeenth CMOS transistor M17, and the erase signal ERASE is connected to a gate of the eighteenth CMOS transistor M18. A nineteenth CMOS transistor M19 (e.g., a PMOS transistor) is connected in series with a twentieth CMOS transistor M20 (e.g., a PMOS transistor) between the second top node $\overline{N6}$ and the system voltage VDD. The clock signal CLK is connected to a gate of the nineteenth CMOS transistor M19, and the programming signal PROG is connected to a gate of the twentieth CMOS transistor M20.

FTL Regular Mode: In this mode, PROG=ERASE=0. Assume that the threshold voltages $V_t$ of the flash transistors have been set to appropriate values corresponding to the weights. When CLK=0, the circuit is reset. In this phase, the first input network 42 and the second input network 44 are connected to the supply, and N5=N6=0, and N1=N2=1. The output Y remains unchanged.

Assume now that an on-set minterm is applied to the inputs in the first input network 42 and the second input network 44. With the properly assigned $V_t$ values to the flash transistors, suppose that $G_L > G_R$ for the given minterm. When CLK: 0→1, both the first input network 42 and the second input network 44 will conduct, and N5 and N6 will both transition from 0→1. Assuming $G_L > G_R$, N5 rises faster than N6, and hence N5 will make M4 active before N6 makes M8 active. This will start to discharge N1 before N2. When N1 falls below the $V_t$ of M7, it will stop further discharge of N2, and turn on M6, resulting in N2: 0→1. Finally, [N1, N2]=[0,1] sets the SR latch, resulting in Y=1. For an offset minterm, $G_L < G_R$ and [N1, N2]=[1,0] resulting in Y=0.

The conventional circuit architectures used in flash memories are not suitable for programming the FTL cell 10 because it has to also perform logic operations. Consequently, a new programming interface is presented for an off-chip programmer circuit (e.g., the programming logic 58 of FIG. 4B) to set the $V_t$ values of the FTL cell 10.

FTL Programming Mode: (ERASE=0, PROG=1, CLK=0, ROW=0, COL=0, HiV=20 volts (V)). The ERASE and PROG signals turn on M13 and M14 and turn off M16. In this state, the source of each flash transistor is floating while the drain and the bulk are connected to the ground. With the appropriate column and row transistors activated by the address signal, high voltage signal HiV pulses are passed from $MC_1$ through $MR_j$ to the gate of the flash transistor, to set the desired threshold voltage ($V_{ti}$).

FTL Erase Mode: (ERASE=1, PROG=1, CLK=0, ROW=0, COL=0, HiV=−20 V). M14 is turned off by the ERASE signal. Both the source and drain of the flash transistors are floating in this state, while the body is connected to ground. A negative HiV pulse at the gate terminal of all the flash transistors in this state will tunnel the charge from the floating gate, thereby erasing the flash transistor.

V. Modified Perceptron Learning Algorithm

Figure 5:
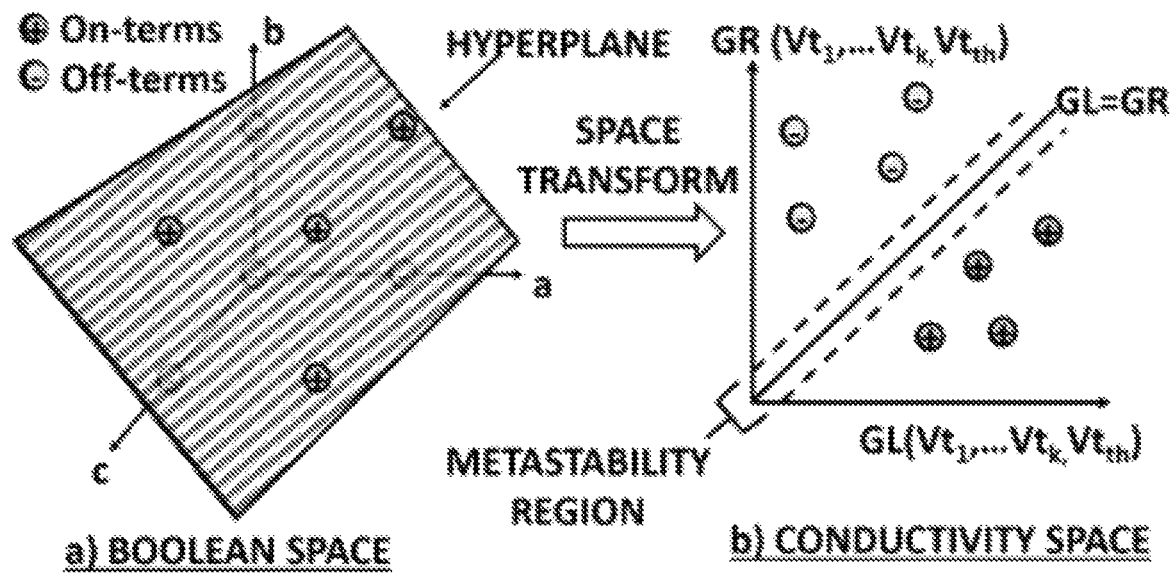
FIG. 5 is a graphical representation of a transformation from Boolean space to conductivity space for the FTL cell of FIG. 1.

FIG. 5 is a graphical representation of a transformation from Boolean space to conductivity space for the FTL cell 10 of FIG. 1. The FTL cell 10 is an implementation of a binary perceptron. The threshold voltages of the flash transistors serve as a proxy for the weights of the perceptron. The problem is to determine the vector of flash transistor threshold voltages so that the programmed FTL cell 10 will correctly compute a given threshold function $(W,T)=(w_1, w_2, \ldots, w_n; T)$ (see Equation 1). The FTL cell 10 performs the computation by comparing the conductivity of the first input network 42 and the second input network 44, which are denoted by $G_L$ and $G_R$ respectively. Therefore, the problem is to find a mapping between the Boolean space and the conductivity space $(G_L, G_R)$ such that $G_L > G_R$ if $w_i \cdot x_i > T$, and $G_L < G_R$ if $w_i \cdot x_i < T$, for all $(x_1, x_2, \ldots x_n) \in (0,1)^n$ (i.e., every minterm). This mapping is illustrated in FIG. 5.

$G_L$ and $G_R$ are non-linear functions of all the flash transistor threshold voltages, the time-varying drain and source voltages of the input transistors, and the layout parasitics that vary from instance to instance. To account for these dependencies, $G_L$ and $G_R$, in principle, must be obtained by solving a set of differential equations. The differential equations can be simultaneously solved numerically and the binary classification performed by a modified version of the classical perceptron learning algorithm.

The perceptron learning algorithm starts with an initial hyperplane in the Boolean space and iteratively adjusts it until all the onset minterms and offset minterms fall on opposite sides of the hyperplane. Each minterm corresponds to some point in the $(G_L, G_R)$ space. The modified perceptron learning algorithm iteratively adjusts the flash transistor threshold voltages such that points in the conductivity space that correspond to onset and offset minterms fall in either side of the line $G_L=G_R$, as illustrated in FIG. 5. HSPICE or another technique can be used to determine whether any point falls above or below this line.

A description of the modified perceptron learning algorithm follows: The threshold voltages of the flash transistors associated with the input transistors in the first input network 42 and the second input network 44 are labelled $V_{t1}$, $V_{t2}, \ldots, V_{tn}$. In addition, there are two special flash transistors, whose threshold voltages are $V_{l,0}$ and $V_{r,0}$ associated with the first input network 42 and the second input network 44, respectively. For a threshold function $f=(w_1, w_2, \ldots, w_n; T)$, the $V_{ti}$, $1 \le i \le n$ correspond to the weights $w_i$ of a threshold function, whereas only one of $V_{l,0}$ or $V_{r,0}$ is associated with the threshold T of $f$. If $V_{l,0}$ is associated with T, then $V_{r,0}=V_{dd}$, effectively turning it off. If $V_{r,0}$ is associated with T, then $V_{l,0}=V_{dd}$. For illustrative purposes, $V_{l/r,0}$ refers to the one that is used for T.

For a given truth table (TT) of $f$, the modified perceptron learning algorithm applies all the minterms of $f$ to the FTL cell, and records the HSPICE response in an array called OT (output table). For a given minterm $m_i$, if $TT(m_i)=OT(m_i)$ then the response is called a correct response, otherwise it is called an incorrect response. An FTL cell is completely programmed if the recorded response for every minterm is correct. Until the FTL cell is completely programmed, at least one minterm would generate an incorrect response. In the event of an incorrect response associated with minterm $m_i$, the modified perceptron learning algorithm adjusts the threshold voltages of all the on input transistors by an amount equal to the minimum increment $\delta$, using the following equations (k denotes the iteration number of the modified perceptron learning algorithm):

$$V_{ti}^{k+1} = V_{ti}^k - \delta m_i; m_i \cdot W \ge T; \delta \le V_{ti}^k \le V_{DD} - \delta \qquad \text{Equation 3}$$

$$V_{ti}^{k+1} = V_{ti}^k + \delta m_i; m_i \cdot W < T; \delta \le V_{ti}^k \le V_{DD} - \delta \qquad \text{Equation 4}$$

Since the $V_{ti}$ values are bounded above and below, it might not be possible to satisfy the truth table using the $V_{ti}$ alone. In such cases, the algorithm modifies $V_{l/r,0}$ as follows:

$$V_{l/r,0}^{k+1} = V_{l/r,0}^k + \delta; m_i \cdot W \ge T; \delta - V_{DD} \le V_{l/r,0}^k \le V_{DD} - \delta \qquad \text{Equation 5}$$

$$V_{l/r,0}^{k+1} = V_{l/r,0}^k - \delta; m_i \cdot W < T; \delta - V_{DD} \le V_{l/r,0}^k \le V_{DD} - \delta \qquad \text{Equation 6}$$

Given a threshold function, the modified perceptron learning algorithm is guaranteed to converge if there is a feasible threshold voltage set assignment $V^*_t$ for the FTL cell 10. The proof of convergence proceeds along the same lines as the perceptron learning algorithm. For an n-input threshold function, a pessimistic upper bound on the number of iterations required by the modified perceptron learning algorithm is given by $kmax=2n\|V^*_t\|^2/\delta^2$.

A. Training for Robustness

The modified perceptron learning algorithm does not consider whether the points are in the metastability region around the line $G_L=G_R$ (see FIG. 5). Even though minterms are classified correctly, they can be arbitrarily close to the line. The further away a minterm is from the line, the easier (and faster and more robust) it will be for the sense amplifier 46 to detect the difference between N5 and N6, and discharge the appropriate side (N1 or N2) first. In order to make the FTL cell 10 highly robust, a capacitance $C_1$ (which serves as a stress) is introduced on a circuit node corresponding to the first differential signal N1 when classifying an onset minterm, and determining the maximum value of $C_1$ for which the modified perceptron learning algorithm converges. Similarly, a capacitance $C_0$ is added on a circuit node corresponding to the second differential signal N2 when classifying an offset minterm. The corresponding threshold voltages found by the modified perceptron learning algorithm will increase the gap between $G_L$ and $G_R$, which not only improves the speed of the FTL cell 10, but also allow it to operate correctly even with process variations, transistor mismatches, and noise. This is analogous to sizing devices in conventional CMOS logic to improve yield but without the area and power penalty.

VI. Evaluation Results

For evaluation of the FTL cell 10, the Taiwan Semiconductor Manufacturing Company (TSMC) 40 nanometer (nm) low power (LP) library was used. As this library did not contain models for flash transistors, flash transistors from M. Abusultan and S. P. Khatri, "Implementing Low Power Digital Circuits using Flash Devices," in *IEEE/ACM ICCD*, October 2016, were used and were suitably modified to reflect the characteristics and variations of the TSMC 40 nm LP library. A complete layout of the FTL cell 10 (including programming devices) was generated and the parasitics for this design were extracted. An exclusive multi-corner analysis was performed for the parasitic extracted netlist of the FTL cell 10 using HSPICE simulations.

For a 5-input FTL cell, all the threshold functions from 1 to 5 variables (117 functions) were implemented. This was done by training the parasitic extracted netlist of the FTL cell for robustness (as discussed above in Section V-A). It should be noted that programming an FTL cell does not change the gate or net parasitics.

Figure 6:
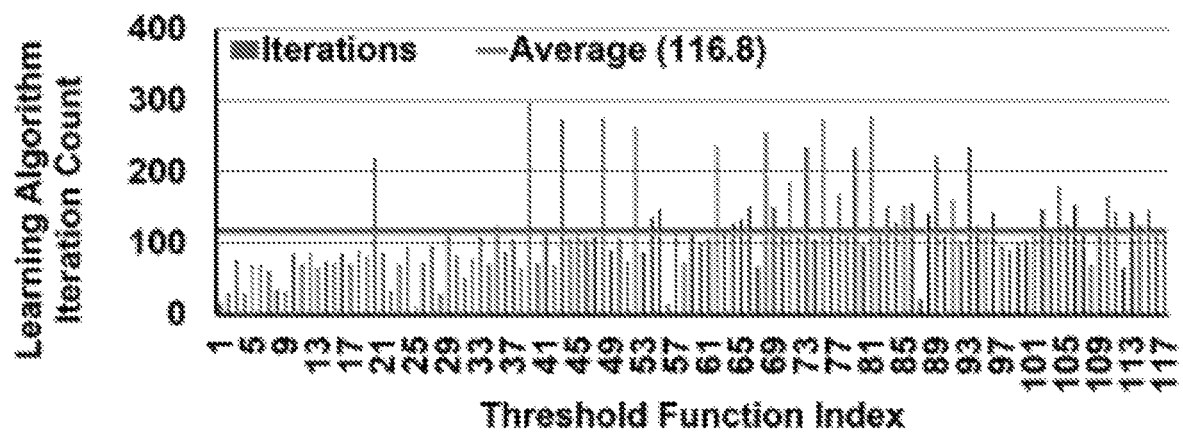
FIG. 6 is a graphical representation of iteration counts required for a modified perceptron learning algorithm to train each of the threshold functions using the FTL cell 10 of FIG. 1.

FIG. 6 is a graphical representation of iteration counts required for the modified perceptron learning algorithm to train each of the threshold functions using the FTL cell 10 of FIG. 1. Depending on the function, the iterations required to find the $V_t$ assignment varies. Typically, the iterations required to converge to a $V_t$ solution increases with an increase in the number of support variables of the specified threshold function.

A. Cell Count, Area, Delay, and Power Comparison

For comparing the PPA of the FTL cell 10 against standard CMOS versions of all the 117 threshold functions, synthesis was done using TSMC 40 nm LP standard cells (CMOS baseline) using Genus and the placement and routing was done using Innovus. The area of the FTL cell 10 was extracted by creating a standard cell layout of the cell using the TSMC 40 nm LP PDK. The delay (datapath+setup time+clock-to-Q) and power numbers were extracted by simulating the circuits at 25° C. at 20% input switching activity. While the power for the CMOS baseline varies depending on the switching activity, the power of the FTL cell 10 does not fluctuate much. This is because of the sense amplifier 46 in the FTL cell 10, which performs an evaluation regardless of changes in the input values, at every clock cycle.

Figure 7A:
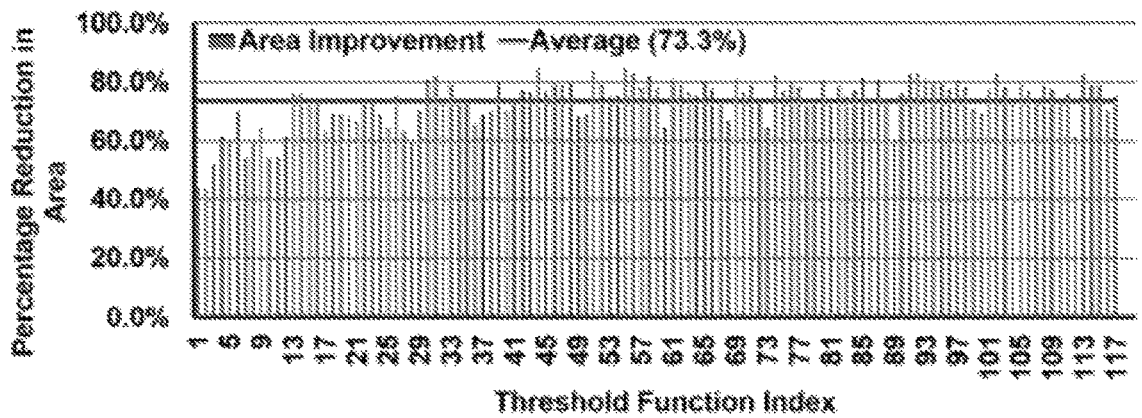
FIG. 7A is a graphical representation of area improvements of the FTL cell as compared to post-layout standard cell complementary metal-oxide-semiconductor (CMOS) equivalent circuits in 40 nanometers (nm).
Figure 7B:
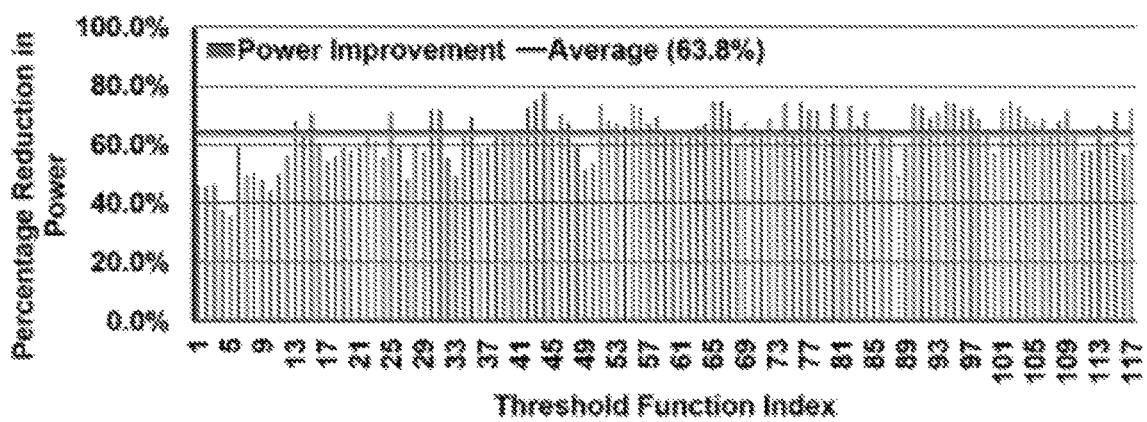
FIG. 7B is a graphical representation of power improvements of the FTL cell as compared to post-layout standard cell CMOS equivalent circuits in 40 nm.
Figure 7C:
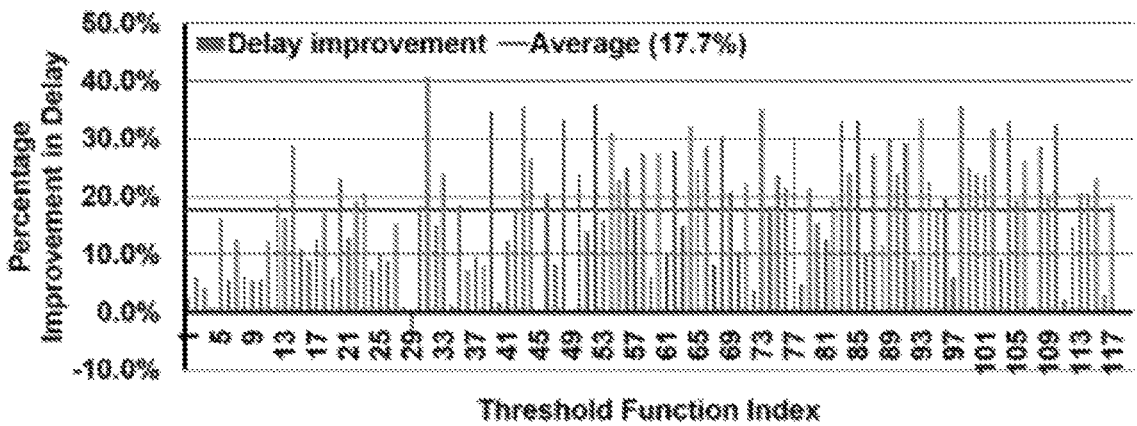
FIG. 7C is a graphical representation of delay improvements of the FTL cell as compared to post-layout standard cell CMOS equivalent circuits in 40 nm.

FIG. 7A is a graphical representation of area improvements of the FTL cell 10 as compared to post-layout standard cell CMOS equivalent circuits in 40 nm. FIG. 7B is a graphical representation of power improvements of the FTL cell 10 as compared to post-layout standard cell CMOS equivalent circuits in 40 nm. FIG. 7C is a graphical representation of delay improvements of the FTL cell 10 as compared to post-layout standard cell CMOS equivalent circuits in 40 nm. FIGS. 7A-7C show a significant improvement in area (73.3%), delay (17.7%) and power (63.8%) of FTL cell 10 implementations against their respective standard cell counterparts. This improvement comes from the combination of the flash transistors' flexibility with the low area, and low power structure of the sense amplifier 46.

B. Robustness

For various functions implemented on the FTL cell 10, 100K Monte Carlo (MC) simulations were performed to estimate the yield in the presence of process variations. For the threshold function $f=ab+ac+ad+ae$ mapped to [4,1,1,1,1;5], Table I below shows that both the delay and the functional yield of the FTL cell can be improved by increasing the capacitances $C_1$ and $C_0$ (collectively denoted as $C_{1/0}$) while training the FTL for robustness. This is because both the delay and functional yield improve with an increase in the voltage gap between N5 and N6, which is a byproduct of the training algorithm (as discussed in Section V-A).

TABLE I

| $C_{1/0}$ (fF) | $V_t$ Values (V) ($V_{t1}$, $V_{t2}$, $V_{t3}$, $V_{t4}$, $V_{t5}$; $V_{l,0}$, $V_{r,0}$) | Yield | Delay (ps) |
|---|---|---|---|
| 0.00 | 0.58, 0.74, 0.7, 0.74, 0.72; 1.00, 0.65 | 34.6% | 152.4 |
| 0.01 | 0.58, 0.74, 0.7, 0.74, 0.72; 1.00, 0.64 | 48.6% | 149.4 |
| 0.05 | 0.58, 0.72, 0.7, 0.72, 0.72; 1.00, 0.64 | 62.2% | 147.6 |
| 0.10 | 0.34, 0.6, 0.58, 0.62, 0.62; 1.00, 0.56 | 80.4% | 112.9 |
| 0.20 | 0.38, 0.6, 0.58, 0.62, 0.62; 1.00, 0.56 | 100% | 113.5 |

Figure 8:
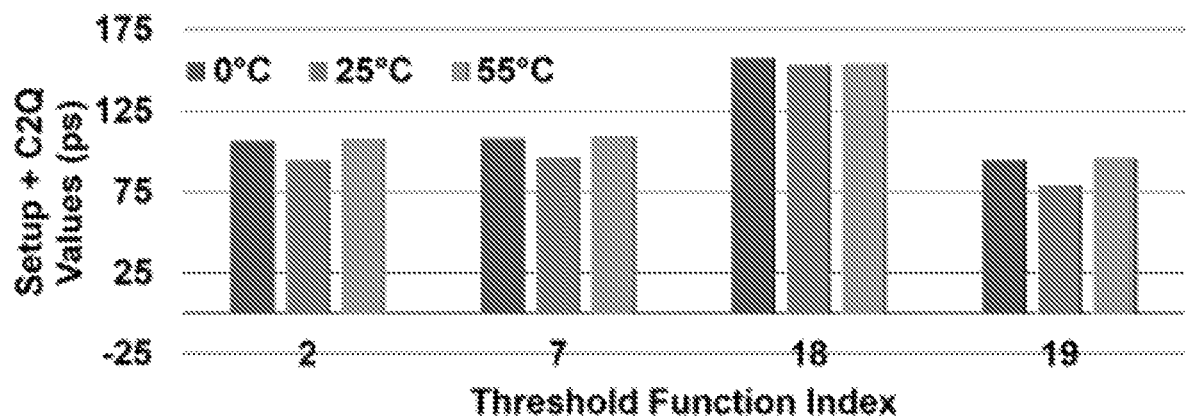
FIG. 8 is a graphical representation comparing delay of the FTL cell of FIG. 1 when programmed at various temperatures.

FIG. 8 is a graphical representation comparing delay of the FTL cell 10 when programmed at various temperatures. FIG. 8 shows the delay of the FTL cell 10 when programmed for a few threshold functions at 0° C., 25° C. and 55° C. Since the training was performed at 25° C., the delay of an FTL cell is minimum at 25° C. This suggests the possibility of reconfiguring the FTL cells for an optimal delay in the field based on the temperature.

VII. Extensions of the FTL Cell-Based Design

A. Kill Switch Functionality

In some examples, the FTL cell 10 described in Sections I-VI above can be modified to provide a "kill switch" functionality. This can be a key security feature of FTL cell-based designs. In one embodiment, the FTL cell 10 can provide a kill switch which can render the circuit inoperable. For example, this can be invoked when custody of a device (e.g., a computer, a mobile device, etc.) incorporating one or more FTL cells 10 is suspected to have been lost. The feature is not permanent—the device can be re-programmed once it is safely returned to the legitimate owner.

The kill switch can be triggered under either automatic or operator-controlled conditions. Automatic triggers for the kill switch can include significant acceleration (indicating movement of the device beyond programmed parameters), removal of an IC from a printed circuit board (PCB), or the collapse of a given power supply. The operator command for the kill operation can be delivered wirelessly, or over a network or direct wired connection.

Figure 9:
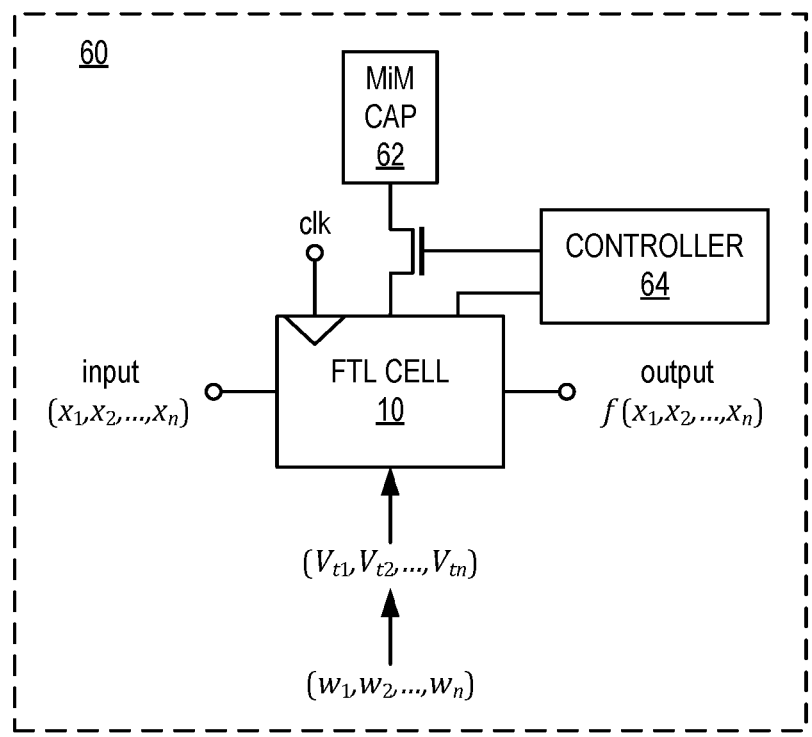
FIG. 9 is a schematic diagram of an exemplary integrated circuit (IC) incorporating the FTL cell 10.

FIG. 9 is a schematic diagram of an exemplary IC 60 incorporating the FTL cell 10. In some examples, an on-chip metal-insulator-metal (MiM) capacitor 62 is used to store the charge (energy) required to implement the kill functionality. Alternate means to store energy may be used as well in other embodiments. Since the kill function is implemented using the (limited) energy stored in the on-chip MiM capacitor 62, an appropriate number of floating gate transistors are reprogrammed to their new threshold voltage values to achieve a functional change of the circuit after the kill switch operation. In one embodiment, all the floating gate devices of the FTL cell 10 may be returned to their erase threshold voltage.

The IC 60 can also include a controller 64 to implement the kill switch functionality and render the FTL cell 10 inoperable (e.g., by disabling one or both of the input networks 42, 44). In some examples, the controller 64 is dedicated to the kill switch functionality, and in other embodiments the controller 64 provides additional functionality for the IC 60. Accordingly, the controller 64 can be implemented in discrete logic, or in another processing device (e.g., as described further below in Section VIII).

An alternate embodiment of the kill switch circuitry may use fuses to completely disable access to all programming circuits for the FTL cell 10 after initial programming, thereby eliminating the capability to read, modify or write any threshold voltages in the future. This approach would generally disable the owner from modifying the threshold voltages in the future as well.

B. Aging and Environmental Resilience of FTL-Based Circuits

In recent technology nodes, CMOS circuit designs undergo negative bias temperature instability (NBTI) or positive bias temperature instability (PBTI) based aging. This can be a significant problem for secure circuits designed for military or space systems, which may require operational lifetimes in the decades. With the FTL-based circuit design described herein, when the IC is determined to have slowed down beyond a threshold (e.g., using ring oscillator-based aging detector circuits or other aging detection methods), a reprogramming condition can be met and the floating gate devices of the FTL cells 10 can be reprogrammed with new threshold voltages, which results in faster FTL cells 10, and an enhanced lifetime.

Based on the rate at which threshold voltages degrade with IC age, one can determine the maximum lifetime of an FTL-based IC without reprogramming flash threshold voltages. The threshold voltages for the flash transistors can be determined such that the IC has a guaranteed user-specified lifetime. If the desired lifetime is greater than the maximum lifetime achievable without re-programming, a fixed threshold voltage re-programming schedule can be determined (e.g., an additional or alternative reprogramming condition) to ensure that this desired lifetime is accomplished. The flash transistors are then re-programmed according to the re-programming schedule. In an alternate embodiment, re-programming is done on an as-needed basis, by periodically testing the delay of the circuit, and invoking a re-programming event when the delay gets sufficiently close to a maximum allowable delay. When the IC delay reaches the maximum allowable delay again, the flash transistors are re-programmed to reduce the delay again.

In another embodiment, the threshold voltages of the flash transistors can be tailored for different operating temperature ranges (e.g., different reprogramming conditions). This could significantly increase the overall operating temperature range of FTL-based ICs, which could be particularly useful for operation in harsh conditions (e.g., environments with large diurnal or annual temperature ranges like military, automotive, space, etc.). For example, one could have a set of threshold voltages for summer use and another for winter use. Alternately, one could have a different set of threshold voltages when the ambient temperature exceeds a specific value.

Finally, for extreme high reliability circuits, additional redundant floating gate devices can be used in the first input network 42 and the second input network 44 to provide wear leveling. In the condition in which a particular flash transistor degrades, it can be replaced by a redundant flash transistor. Not only does this enhance circuit reliability, but it also makes it even harder for an adversary to reverse engineer the design, since it is unclear whether a redundant transistor is being employed.

C. Secure Logic Testing in FTL-Based ICs

New automatic test pattern generation (ATPG) algorithms can be used in an ATPG tool for FTL-based ICs. Suppose that the set of threshold voltages for all the flash transistors of the FTL cell 10 are referred to as a threshold voltage vector TVV. Assume that the final set of TVVs (STVVs) of all the K FTLs in the IC design is $S_*=\{TVV_1, TVV_2, \ldots, TVV_K\}$, which results in a Boolean function $f_*$. Both $S_*$ and $f_*$ are secrets which should be withheld from the adversary. It is assumed that a vendor that tests the integrated circuit is an adversary. In that case, one may wish to provide the vendor with an alternate set of STVVs, which allow the circuit to be tested without revealing $S_*$ and $f_*$.

To do this, the ATPG tool first produces a set of P STVVs $\{S_1, S_2, \ldots, S_P\}$ which respectively result in Boolean functions $f_1, f_2, \ldots, f_P$. These functions are sorted in decreasing order of their functional difference against $f_*$. A large functional difference means more obfuscation of the intended function $f_*$ from the adversary. For each i, the ATPG is performed on $f_i$, and the fault coverage obtained is quantified. When the cumulative coverage reaches a desired value, all the test vectors are returned and provided to the testing vendor along with $\{S_1, S_2, \ldots, S_P\}$. This achieves the desired fault coverage without ever disclosing $S_*$ or $f_*$. Several methods to compute the functional difference of $f_i$ and $f_*$ exist, such as structural or functional hashes or the Boolean difference of the functions. In one embodiment, the number of STVVs needed to obtain the desired fault coverage is minimized, while not making the number so small that the adversary is able to glean $f_*$.

In another aspect, a delay fault testing tool is created. For this, $f_*$ is first simulated using the STVV $S_*$, to find the worst rising and falling delay from each FTL input to the output. In other embodiments, the delays of each FTL input are found through other means. Next, a new STVV $S_i$ is constructed for each input $x_i$, to exercise these worst-case delays. In an alternate embodiment, $x_{i,r}$ is constructed to exercise the rising delay and $x_{i,f}$ is constructed to exercise the falling delay in two STVVs $S_{i,r}$ and $S_{i,f}$ respectively. The remaining threshold voltages in $S_i$ (or $S_{i,r}$ and $S_{i,f}$) are filled-in so that the functional difference between $f_*$ and $f_i$ is maximized, to enhance obfuscation. This exercise will be repeated for each input $x_i$ in each FTL. The testing vendor is provided with $\{S_1, S_2, \ldots, S_P\}$ (or $S_{1r}, S_{1f}, S_{2r}, S_{2f}, \ldots S_{Pr}, S_{Pf}$) and the test vectors, thus achieving the desired fault coverage without disclosing $S_*$ or $f_*$.

In another embodiment, a single STVV S is constructed whose timing characteristics are the same as (or stricter than) $S_*$. In yet another embodiment, device threshold voltages are selected to generate the identical delay for each critical path to $f_*$. A predetermined number of critical paths can be processed, each providing its set of threshold voltages. Finally, the resulting sets of threshold voltages are used to create TVVs. In one embodiment, a single set of threshold voltages yields a TVV. In another embodiment, multiple threshold voltages are combined in a single TVV as long as each threshold voltage applies to a different flash transistor.

D. FTL-Specific Fault Models

Another aspect described herein is the use of FTL-specific fault models. In the FTL cell 10, on-set as well as off-set minterms each contribute a point (on either side of the diagonal) of the conductivity space, as described in FIG. 6. Suppose that over all the minterms m of an FTL cell, the minimum distance d between the two points of a minterm is Δ. An FTL fault can be defined as the truth value of the condition (d<Δ). In other words, if (d<Δ), then a fault is said to have occurred. Testing an FTL cell 10 using this model may be performed by providing at least one additional flash device in both the first input network 42 and the second input network 44, which is programmed to have conductance Δ when that device is turned on. By turning this device on for all minterms, the FTL fault may be detected. In the event of an FTL fault, the value of a minterm would be different than in the fault-free circuit.

E. Trojan Detection

In another aspect described herein, the FTL cell 10 can be used for Trojan detection. Suppose there is a Trojan hardware, which is triggered by a direct command from a malicious operator through the conventional input-output ports of the IC. Alternatively, the Trojan may leak information through the conventional input-output ports of the IC. By using a full-scan based approach, any Trojan is detected during manufacturing testing of the IC. The modified functionality due to the Trojan can be detected during scan-based testing in this embodiment.

Suppose the malicious party inserts a Trojan whose sequential elements are not included in the scan chain. Such a Trojan cannot communicate out of the IC, or have a malicious operator communicate to the Trojan from outside. In one embodiment, by time-frame expansion up to k steps, with a run-time reset applied to the circuit after k clock cycles, such a Trojan may be detected.

VIII. Computer System

Figure 10:
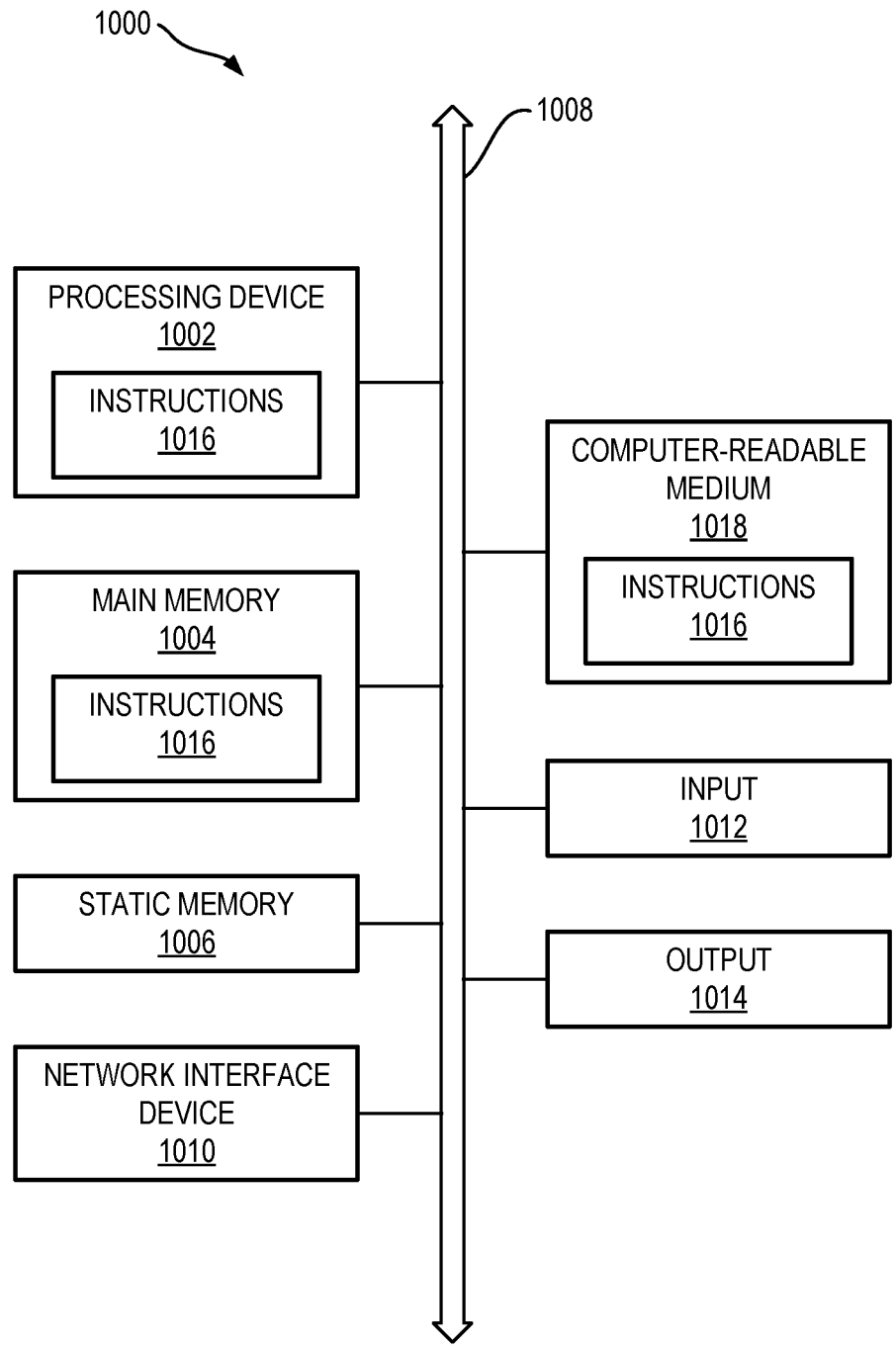
FIG. 10 is a schematic diagram of a generalized representation of an exemplary computer system.

FIG. 10 is a schematic diagram of a generalized representation of an exemplary computer system 1000 that could include the FTL cell of FIG. 1 and/or could be used to perform any of the methods or functions described above, such as designing or programming the FTL cell. In this regard, the computer system 1000 may be a circuit or circuits included in an electronic board card, such as, a PCB, a server, a personal computer, a desktop computer, a laptop computer, an array of computers, a personal digital assistant (PDA), a computing pad, a mobile device, or any other device, and may represent, for example, a server or a user's computer.

The exemplary computer system 1000 in this embodiment includes a processing device 1002 (e.g., the FTL cell of FIG. 1) or processor, a main memory 1004 (e.g., read-only memory (ROM), flash memory, dynamic random access memory (DRAM), such as synchronous DRAM (SDRAM), etc.), and a static memory 1006 (e.g., flash memory, SRAM, etc.), which may communicate with each other via a data bus 1008. Alternatively, the processing device 1002 may be connected to the main memory 1004 and/or static memory 1006 directly or via some other connectivity means. In an exemplary aspect, the processing device 1002 may include the FTL cell of FIG. 1 and/or could be used to perform any of the methods or functions described above, such as designing or programming the FTL cell.

The processing device 1002 represents one or more general-purpose processing devices, such as a microprocessor, central processing unit, or the like. More particularly, the processing device 1002 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 1002 is configured to execute processing logic in instructions for performing the operations and steps discussed herein.

The various illustrative logical blocks, modules, and circuits described in connection with the embodiments disclosed herein may be implemented or performed with the processing device 1002, which may be a field-programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 1002 may be a microprocessor, or may be any conventional processor, controller, microcontroller, or state machine. The processing device 1002 may also be implemented as a combination of computing devices (e.g., a combination of a DSP and a microprocessor, a plurality of microprocessors, one or more microprocessors in conjunction with a DSP core, or any other such configuration).

The computer system 1000 may further include a network interface device 1010. The computer system 1000 also may or may not include an input 1012, configured to receive input and selections to be communicated to the computer system 1000 when executing instructions. The computer system 1000 also may or may not include an output 1014, including but not limited to a display, a video display unit (e.g., a liquid crystal display (LCD) or a cathode ray tube (CRT)), an alphanumeric input device (e.g., a keyboard), and/or a cursor control device (e.g., a mouse).

The computer system 1000 may or may not include a data storage device that includes instructions 1016 stored in a computer-readable medium 1018. The instructions 1016 may also reside, completely or at least partially, within the main memory 1004 and/or within the processing device 1002 during execution thereof by the computer system 1000, the main memory 1004, and the processing device 1002 also constituting computer-readable medium. The instructions 1016 may further be transmitted or received via the network interface device 1010.

While the computer-readable medium 1018 is shown in an exemplary embodiment to be a single medium, the term "computer-readable medium" should be taken to include a single medium or multiple media (e.g., a centralized or distributed database, and/or associated caches and servers)

that store the one or more sets of instructions 1016. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

What is claimed is:

1. A floating gate-based threshold logic cell in an integrated circuit, comprising:
    a first input network comprising a first set of semiconductor switching devices;
    a second input network comprising a second set of semiconductor switching devices;
    a sense amplifier coupled to the first input network and the second input network, wherein the sense amplifier comprises a third set of semiconductor switching devices; and
    a memory element comprising a fourth set of semiconductor switching devices coupled to one or more outputs of the sense amplifier,
    wherein the first set of semiconductor switching devices comprises at least one floating gate transistor,
    wherein the second set of semiconductor switching devices comprises at least one floating gate transistor with a programmable threshold voltage, and
    wherein the floating gate-based threshold logic cell is configured to alter each respective threshold voltage of the at least one floating gate transistor to render the floating gate-based threshold logic cell inoperable in response to a kill switch trigger.

2. The floating gate-based threshold logic cell of claim 1, wherein the second set of semiconductor switching devices comprises a plurality of floating gate transistors with a programmable threshold voltage programmable to a unique value for each floating gate transistor.

3. The floating gate-based threshold logic cell of claim 2, wherein:
    one or more of the plurality of floating gate transistors have a testing threshold voltage used for functional or at-speed testing of the integrated circuit; and
    the testing threshold voltage is at a different voltage than used during normal operation of the floating gate-based threshold logic cell.

4. The floating gate-based threshold logic cell of claim 1, wherein the floating gate-based threshold logic cell is configured to re-program the threshold voltages of the at least one floating gate transistor to mitigate chip aging or to compensate for environmental operating conditions in response to a re-programming event.

5. The floating gate-based threshold logic cell of claim 1, wherein the threshold voltages of the at least one floating gate transistor are selected such that speed bins of the integrated circuit are altered.

6. A floating gate-based threshold logic cell in an integrated circuit, comprising:
    a first input network comprising a first set of semiconductor switching devices;
    a second input network comprising a second set of semiconductor switching devices;
    a sense amplifier coupled to the first input network and the second input network, wherein the sense amplifier comprises a third set of semiconductor switching devices; and
    a memory element comprising a fourth set of semiconductor switching devices coupled to one or more outputs of the sense amplifier,
    wherein the first input network comprises a first set of inputs connected to a first complementary metal-oxide-semiconductor (CMOS) transistor network in series with a first floating gate transistor network.

7. The floating gate-based threshold logic cell of claim 6, wherein the second input network comprises a second set of inputs connected to a second CMOS transistor network in series with a second floating gate transistor network.

8. The floating gate-based threshold logic cell of claim 6, wherein respective inputs of the first input network and the second input network are complementary.

9. The floating gate-based threshold logic cell of claim 6, wherein the first input network and the second input network each comprise one or more flash devices for testing or calibration of a floating gate threshold logic fault.

10. A floating gate-based threshold logic cell in an integrated circuit, comprising:
    a first input network comprising a first set of semiconductor switching devices;
    a second input network comprising a second set of semiconductor switching devices;
    a sense amplifier coupled to the first input network and the second input network, wherein the sense amplifier comprises a third set of semiconductor switching devices;
    a memory element comprising a fourth set of semiconductor switching devices coupled to one or more outputs of the sense amplifier; and
    a floating gate transistor programming logic configured to provide weights of a threshold function performed by the floating gate-based threshold logic cell.

11. The floating gate-based threshold logic cell of claim 10, wherein the floating gate transistor programming logic is configured to:
    set a state of the floating gate-based threshold logic cell to a programming mode; and
    in the programming mode, set a threshold voltage of one or more floating gate transistors to a user-specified value.

* * * * *